United States Patent
Kim et al.

(10) Patent No.: US 10,842,033 B2
(45) Date of Patent: *Nov. 17, 2020

(54) DISPLAY DEVICE AND PORTABLE TERMINAL

(71) Applicant: Samsung Display Co., Ltd., Yongin-si (KR)

(72) Inventors: Tae-Eun Kim, Seoul (KR); Jaechun Park, Cheonan-si (KR); Younhwan Jung, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/919,087

(22) Filed: Mar. 12, 2018

(65) Prior Publication Data

US 2018/0206350 A1 Jul. 19, 2018

Related U.S. Application Data

(63) Continuation of application No. 15/234,962, filed on Aug. 11, 2016, now Pat. No. 9,961,789.

(30) Foreign Application Priority Data

Nov. 19, 2015 (KR) ........................ 10-2015-0162741

(51) Int. Cl.
| | | |
|---|---|---|
| *H05K 5/02* | (2006.01) | |
| *H04M 1/02* | (2006.01) | |
| *H04M 1/18* | (2006.01) | |
| *G06F 1/16* | (2006.01) | |

(Continued)

(52) U.S. Cl.
CPC ............. *H05K 5/0217* (2013.01); *G06F 1/16* (2013.01); *G06F 1/1626* (2013.01); *G06F 1/1637* (2013.01); *H04M 1/0266* (2013.01); *H04M 1/185* (2013.01); *H05K 5/0017* (2013.01); *H05K 5/0086* (2013.01); *H05K 7/20963* (2013.01); *H04M 1/0277* (2013.01)

(58) Field of Classification Search
CPC ............................... H05K 5/0217; G06F 1/16
USPC ....................................................... 361/704
See application file for complete search history.

(56) References Cited

U.S. PATENT DOCUMENTS 7,973,473 B2    7/2011   DeCook et al.
8,482,691 B2 *  7/2013   Park ..................... H05K 9/0054
                                                       349/58

(Continued)

FOREIGN PATENT DOCUMENTS

KR           10-1004426 B1    12/2010
KR        10-2011-0110592 A   10/2011

(Continued)

*Primary Examiner* — Mukundbhai G Patel
(74) *Attorney, Agent, or Firm* — Lewis Roca Rothgerber Christie LLP (57) ABSTRACT

A display device includes a display panel configured to display an image, a light blocking member under the display panel, a bracket facing the display panel such that the light blocking member is between the display panel and the bracket, a bridge member between the light blocking member and the bracket, and configured to support a position of the light blocking member and the bracket, and a buffer member at a same layer as the bridge member, and contacting the bridge member.

16 Claims, 6 Drawing Sheets

(51) Int. Cl.
*H05K 5/00* (2006.01)
*H05K 7/20* (2006.01)

(56) References Cited

U.S. PATENT DOCUMENTS

| | | | | |
|---|---|---|---|---|
| 2007/0257254 A1* | 11/2007 | Yang | ............. | H01L 27/3269 |
| | | | | 257/40 |
| 2008/0036367 A1* | 2/2008 | Eida | ............. | H01L 27/322 |
| | | | | 313/504 |
| 2013/0048995 A1* | 2/2013 | Yamazaki | ............. | H01L 51/5259 |
| | | | | 257/59 |
| 2017/0331072 A1* | 11/2017 | Jo | ............. | H01L 51/5259 |

FOREIGN PATENT DOCUMENTS

| | | |
|---|---|---|
| KR | 10-2012-0023897 A | 3/2012 |
| KR | 10-1446501 B1 | 10/2014 |
| KR | 10-1469651 B1 | 12/2014 |
| KR | 10-1485781 B1 | 1/2015 |
| KR | 10-2015-0031641 A | 3/2015 |

\* cited by examiner

DISPLAY DEVICE AND PORTABLE TERMINAL

CROSS-REFERENCE TO RELATED APPLICATION

This application is a continuation of U.S. patent application Ser. No. 15/234,962, filed Aug. 11, 2016, which claims priority to and the benefit of Korean Patent Application No. 10-2015-0162741, filed Nov. 19, 2015, the entire content of both of which is incorporated herein by reference.

BACKGROUND

1. Field

Embodiments of the present invention relate to a display device and a portable terminal having improved durability.

2. Description of the Related Art

A portable terminal, such as a mobile device, is widely used. The portable terminal includes a display panel for displaying an image, and a window member. The window member determines an appearance of the portable terminal. The display panel and the window member are vulnerable to an external impact, and thus the display panel and the window member may be damaged due to impact applied to the portable terminal when the portable terminal is dropped.

SUMMARY

The present disclosure provides a display device having improved durability and improved impact resistance, and also provides a portable terminal having improved durability and improved impact resistance.

Embodiments of the inventive concept provide a display device including a display panel configured to display an image, a light blocking member under the display panel, a bracket facing the display panel such that the light blocking member is between the display panel and the bracket, a bridge member between the light blocking member and the bracket, and configured to support a position of the light blocking member and the bracket, and a buffer member at a same layer as the bridge member, and contacting the bridge member.

The bridge member may be surrounded by the buffer member when viewed in a plan view.

The bridge member may extend along a direction in which at least an edge of the display panel extends.

The bridge member may be provided in a plural number, and the bridge members may be spaced from each other at regular intervals.

The bridge member may extend along a periphery of the display panel.

An area of the bridge member may be less than an area of the buffer member when viewed in a plan view.

A thickness of the bridge member may be the same as a thickness of the buffer member.

The bridge member may include at least one of a polyethylene terephthalate, a stainless steel, or a resin.

Embodiments of the inventive concept provide a display device including a display panel configured to display an image, a light blocking member at a lower surface of the display panel, a buffer member at a lower surface of the light blocking member, a bridge member at the lower surface of the light blocking member, and a bracket facing the display panel such that the light blocking member, the buffer member, and the bridge member are between the bracket and the display panel.

The display device may further include a heat discharge member between the buffer member and the bracket, and overlapping the buffer member, and the bridge member may penetrate through the buffer member and the heat discharge member.

The heat discharge member may include graphite.

The display device may further include a radiating member between the heat discharge member and the bracket, and overlapping the heat discharge member and the bridge member.

A side surface of the bridge member may be surrounded by the buffer member and the heat discharge member.

The bridge member may couple the buffer member and the radiating member.

A thickness of the bridge member may be substantially equal to a distance between the light blocking member and the radiating member.

Embodiments of the inventive concept provide a portable terminal including a display panel including a display surface configured to display an image, and a rear surface opposite the display surface, and a cover panel attached to the rear surface of the display panel, and including a light blocking member under the rear surface of the display panel, a buffer member under the light blocking member, and defining an opening, and a bridge member in the opening and under the light blocking member.

The portable terminal may further include a bracket under the cover panel to support the display panel and the cover panel.

The bridge member may be surrounded by the light blocking member, the buffer member, and the bracket.

The cover panel may further include a heat discharge member overlapping the buffer member, under the buffer member, and defining an opening that is connected to the opening of the buffer member.

The bridge member may be in the opening of the heat discharge member.

According to the above, the display device may have improved durability and improved impact resistance.

BRIEF DESCRIPTION OF THE DRAWINGS

The above and other aspects of the present disclosure will become readily apparent by reference to the following detailed description when considered in conjunction with the accompanying drawings wherein.

DETAILED DESCRIPTION

Features of the inventive concept and methods of accomplishing the same may be understood more readily by reference to the following detailed description of embodiments and the accompanying drawings. Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. In addition, it will also be understood that when an element or layer is referred to as being "between" two elements or layers, it can be the only element or layer between the two elements or layers, or one or more intervening elements or layers may also be present.

In the following examples, the x-axis, the y-axis and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

The terminology used herein is for the purpose of describing particular embodiments only and is not intended to be limiting of the present invention. As used herein, the singular forms "a," "an," and "the" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 1:
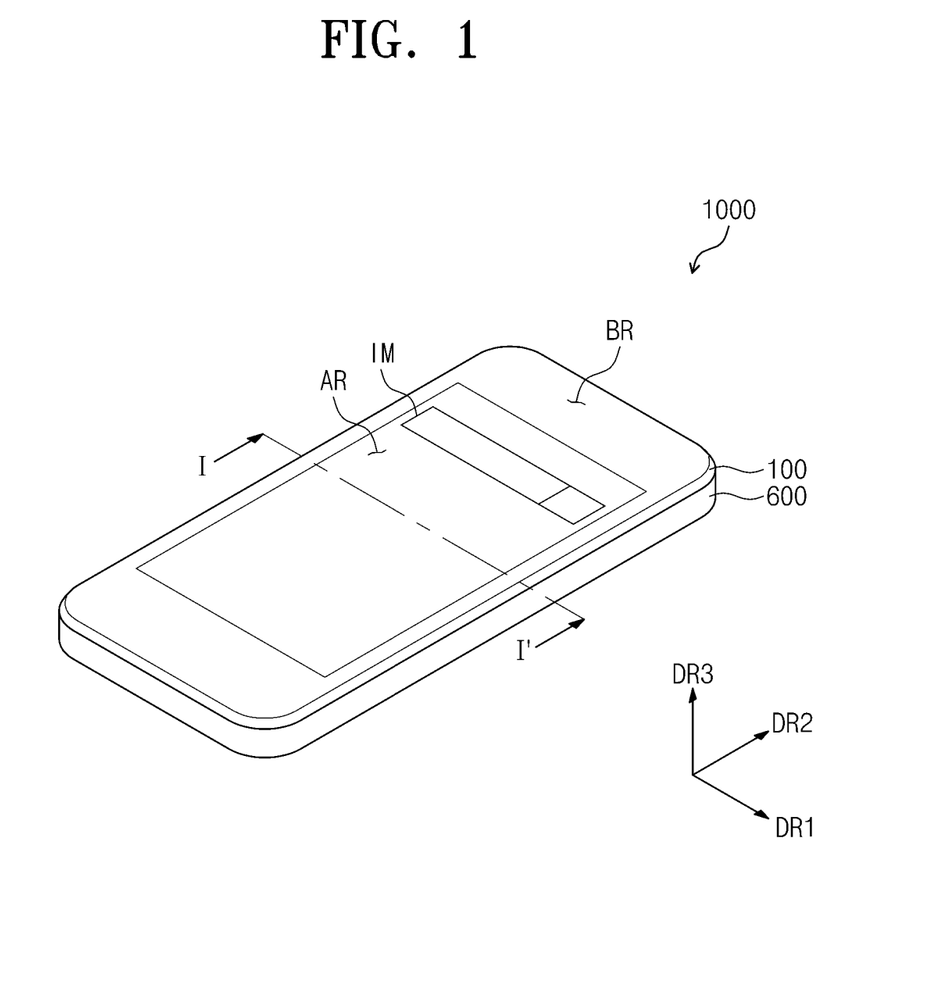
FIG. 1 is a perspective view showing a display device according to an exemplary embodiment of the present disclosure.
Figure 2:
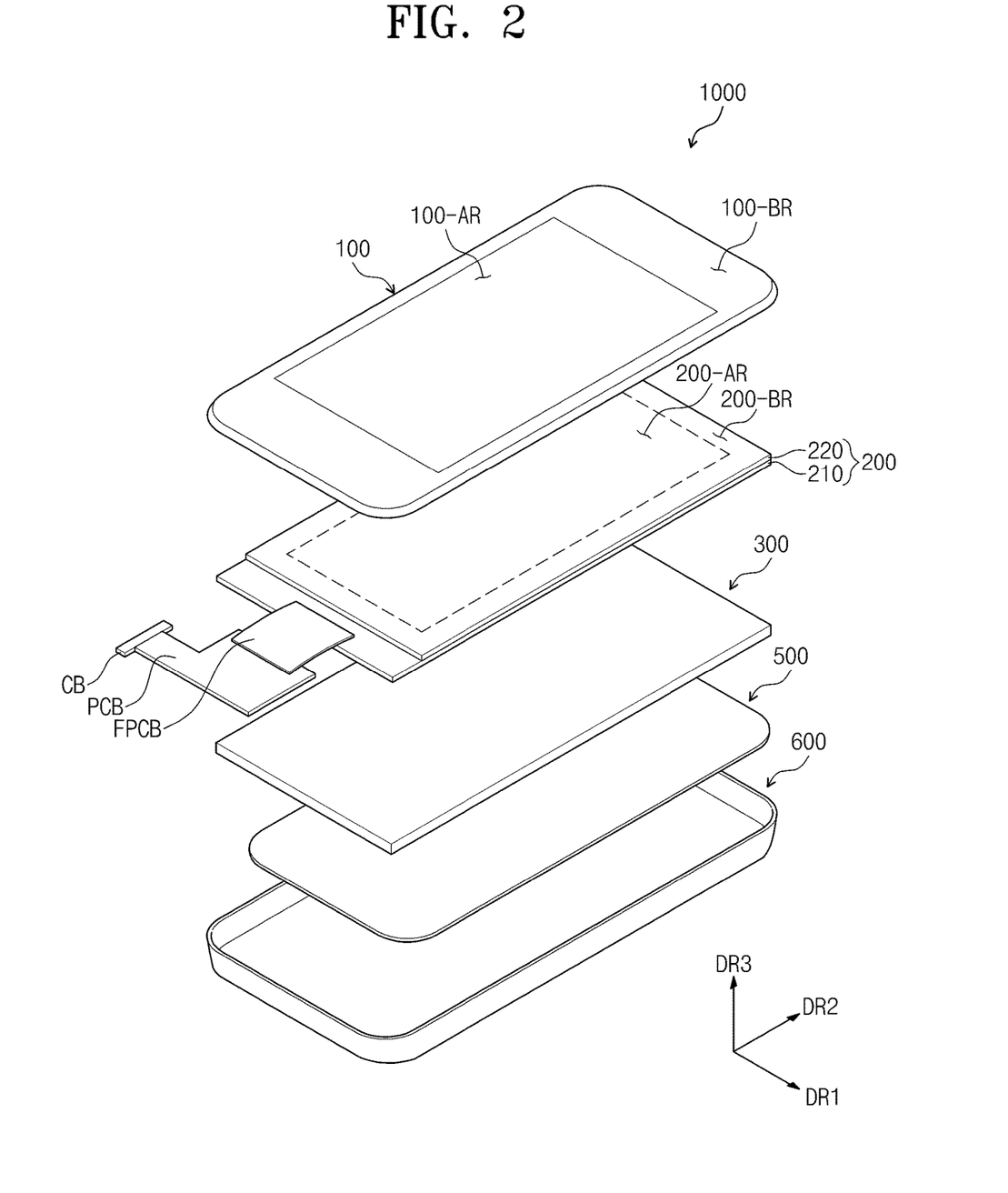
FIG. 2 is an exploded perspective view showing the display device of FIG. 1.

FIG. 1 is a perspective view showing a display device 1000 according to an exemplary embodiment of the present disclosure, and FIG. 2 is an exploded perspective view showing the display device 1000 of FIG. 1.

FIG. 1 shows a portable terminal to which the display device 1000 is applied, as a representative example. The portable terminal may be a tablet PC, a smart phone, a personal digital assistant, a portable multimedia player, a game unit, and/or a wrist-type electronic device, although the portable terminal is not limited thereto or thereby. That is, the display device 1000 may also be applied to a large-sized electronic item, such as a television set, an outdoor billboard, etc., and also applied to small-sized to medium-sized electronic items, such as a personal computer, a notebook computer, a car navigation unit, a camera, etc., although the portable terminal is not limited thereto or thereby.

Referring to FIG. 1, the display device 1000 includes a plurality of areas that are distinct from each other on a display surface. The display device 1000 includes a display area AR in which an image IM may be displayed, and includes a non-display area BR adjacent the display area AR. FIG. 1 shows an internet search window as a representative example of the image IM. In the present exemplary embodiment, the display area AR has a substantially rectangular shape, and the non-display area BR surrounds the display area AR.

Referring to FIGS. 1 and 2, the display device 1000 includes a window member 100, a display panel 200, a cover panel 300, a bracket 500, and a rear case 600.

The window member 100 includes a display area 100-AR for transmitting the image IM provided from the display panel 200, and includes a non-display area 100-BR adjacent the display area 100-AR. The window member 100 is above the display panel 200, and may include a glass, sapphire, and/or plastic material.

The display panel 200 includes a display area 200-AR and a non-display area 200-BR. The display area 200-AR is an area for displaying the image IM, and corresponds to the display area 100-AR of the window member 100. The non-display area 200-BR is adjacent the display area 200-AR, and corresponds to the non-display area 100-BR of the window member 100.

In the present exemplary embodiment, the display panel 200 may be an organic light emitting display panel. The display panel 200 includes a substrate 210, an organic light emitting element (see 230 of FIG. 3), and a sealing layer 220. The organic light emitting element 230 is on the substrate 210, and the sealing layer 220 is on the substrate 210 to seal the organic light emitting element 230 from the outside.

The display panel 200 includes a display surface on which the image IM may be displayed, and includes a rear surface facing, or opposite to, the display surface. In FIG. 2, the display surface corresponds to an upper surface of the sealing layer 220, and the rear surface corresponds to a lower surface of the substrate 210.

The display surface, on which the image IM may be displayed, is substantially parallel to a surface defined by a first direction DR1 and a second direction DR2, while a normal line direction of the display surface corresponds to a third direction DR3. The third direction DR3 indicates a thickness direction of the display device 1000. Front and rear surfaces of each member of the display device 1000 are distinct from each other with respect to the third direction DR3. However, directions indicated by the first, second, and third directions DR1, DR2, and DR3 are relative.

The display device 1000 may further include a flexible printed circuit board FPCB and a printed circuit board PCB.

The flexible printed circuit board FPCB electrically connects the display panel 200 and the printed circuit board PCB. One end of the flexible printed circuit board FPCB is connected to one surface of the substrate 210 that is exposed by, or not covered by, the sealing layer 220, and the other end of the flexible printed circuit board FPCB is connected to the printed circuit board PCB. The flexible printed circuit board FPCB has flexibility, and thus may be bent to a lower portion of the cover panel 300 while being coupled to the printed circuit board PCB.

The printed circuit board PCB is configured to apply a signal to the display panel 200 through the flexible printed circuit board FPCB, or receive a signal from the display panel 200 through the flexible printed circuit board FPCB. The printed circuit board PCB may be attached to the lower portion of the cover panel 300 while being coupled to the flexible printed circuit board FPCB in accordance with the bending of the flexible printed circuit board FPCB. A connector CB may be connected to the printed circuit board PCB to receive the signal from an external source.

The display device 1000 may further include a touch panel. The touch panel may be between the window member 100 and the display panel 200, although the touch panel is not limited thereto or thereby. That is, the touch panel may be in the display panel 200. The touch panel may be operated in a resistive manner, an electrostatic capacitive manner, or an electromagnetic induction manner, and may obtain coordinate information of a position at which a touch event occurs.

The cover panel 300 is attached to a rear surface of the display panel 200. The cover panel 300 may be between the display panel 200 and the printed circuit board PCB. The cover panel 300 will be described in detail later.

The bracket 500 supports the display panel 200 and the cover panel 300. One surface of the bracket 500 is attached to the cover panel 300, and the other surface of the bracket 500 may provide a space in which electronic components are mounted.

The rear case 600 accommodates the display panel 200 and the cover panel 300, and is coupled to the window member 100. The rear case 600 may include a plastic and/or metallic material. In the present exemplary embodiment, the rear case 600 may be omitted.

Figure 3:
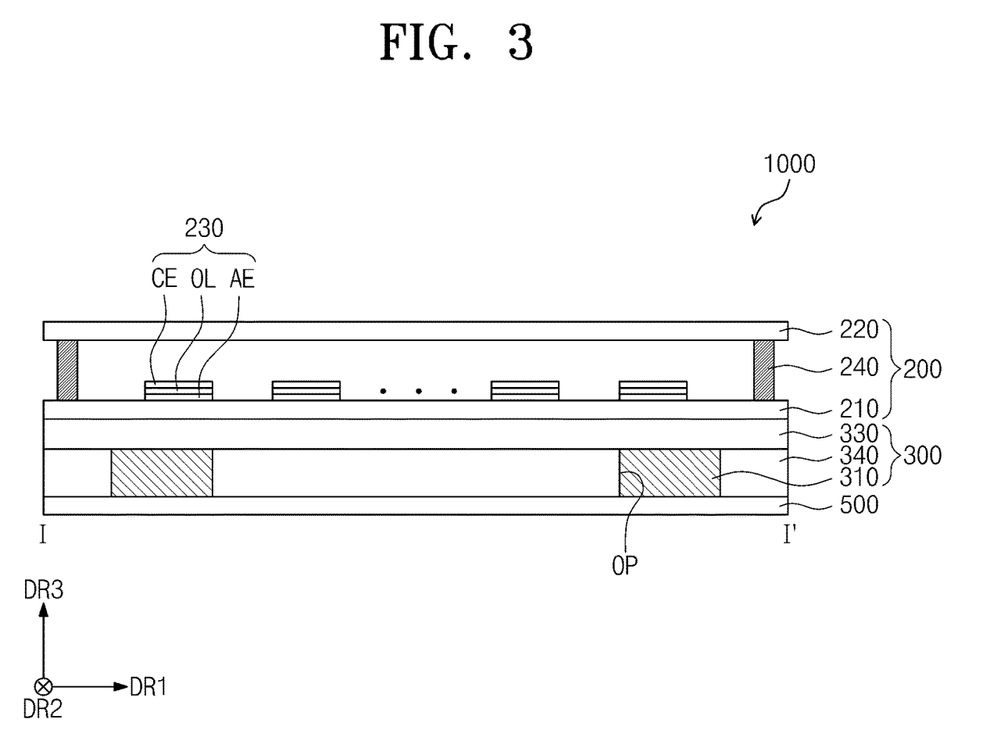
FIG. 3 is a cross-sectional view taken along the line I-I' of FIG. 1.
Figure 4:
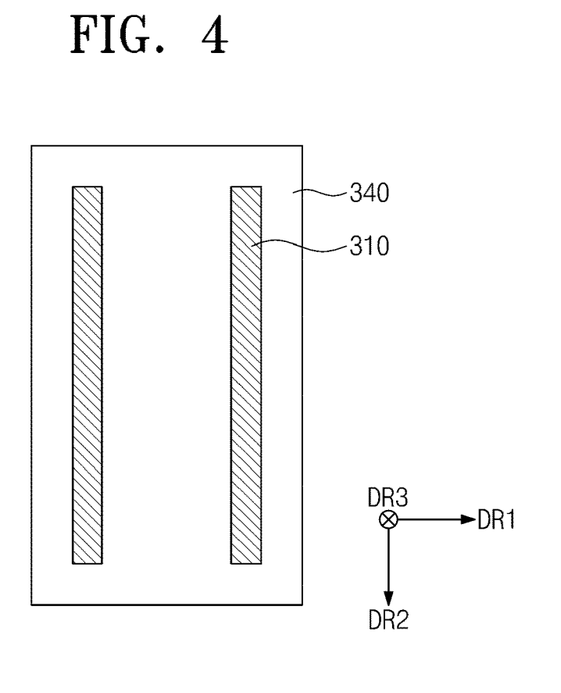
FIG. 4 is a plan view showing a rear surface of a cover panel according to an exemplary embodiment of the present disclosure.

FIG. 3 is a cross-sectional view taken along the line I-I' of FIG. 1, and FIG. 4 is a plan view showing a rear surface of a cover panel according to an exemplary embodiment of the present disclosure. For the convenience of explanation, the window member 100 and the rear case 600 are not shown in FIG. 3.

Referring to FIGS. 2 and 3, the organic light emitting element 230 is disposed on the substrate 210. The organic light emitting element 230 is provided to each pixel of the display panel 200. The organic light emitting element 230 includes a first electrode AE, an organic light emitting layer OL, and a second electrode CE. The first electrode AE may be an anode electrode or a positive electrode. The second electrode CE may be a cathode electrode or a negative electrode. The first electrode AE generates holes, and the second electrode CE generates electrons. The holes generated by the first electrode AE, and the electrons generated by the second electrode CE, are injected into the organic light emitting layer OL, and are recombined in the organic light emitting layer OL to generate excitons, and the organic light emitting element 230 emits the light by the excitons that return to a ground state from an excited state.

The display panel 200 may further include a driving layer between the first electrode AE and the substrate 210, which may include a transistor to apply a driving voltage to the first electrode AE, and may also include gate and data lines connected to the transistor.

The display panel 200 may further include a sealing member 240 between the substrate 210 and the sealing layer 220 to couple the substrate 210 and the sealing layer 220. The sealing member 240 is located along an edge of the display panel 200 when viewed in a plan view. The sealing member 240, in cooperation with the substrate 210 and the sealing layer 220, prevents external moisture and air from entering into the organic light emitting element 230.

The cover panel 300 includes a light blocking member 330, a buffer member 340, and a bridge member 310.

The light blocking member 330 is attached to the rear surface of the display panel 200 to block the light incident to the display panel 200. The light blocking member 330 may include a first light blocking adhesive layer, a light blocking sheet, and a second light blocking adhesive layer.

The first light blocking adhesive layer is between the display panel 200 and the light blocking sheet to attach the light blocking sheet to the rear surface of the display panel 200. The first light blocking adhesive layer includes an optically clear adhesive (OCA) and/or an optically clear resin (OCR). The first light blocking adhesive layer includes a concavo-convex portion at an upper surface of the first light blocking adhesive layer, which makes contact with the rear surface of the display panel 200. The light blocking sheet may be uniformly attached to the rear surface of the display panel 200, because air existing between the first light blocking adhesive layer and the rear surface of the display panel 200 may be discharged when the light blocking sheet is attached to the rear surface of the display panel 200.

The light blocking sheet includes a resin layer containing polyethylene teraphthalate (PET), and includes a light blocking layer at a rear surface of the resin layer. The light blocking layer may be a black tape or a coating layer including a light blocking material.

The second light blocking adhesive layer is between the light blocking sheet and the buffer member 340 to attach the buffer member 340 to the light blocking sheet. The second light blocking adhesive layer includes the optically clear adhesive (OCA) and/or the optically clear resin (OCR).

The buffer member 340 is attached to a rear surface of the light blocking member 330. The buffer member 340 distributes an impact applied to the display panel 200 and the window member 100. The buffer member 340 absorbs a portion of the impact applied to the display panel 200 and the window member 100 to reduce or prevent damage to the display panel 200 and the window member 100. The buffer member 340 includes a polymer resin (e.g., polyurethane, polycarbonate, polypropylene, polyethylene, etc.), and/or a sponge formed by foam molding a rubber solution, a urethane-based material, or an acrylic-based material.

The buffer member 340 may include, or define, an opening OP formed therethrough when viewed in a plan view. The bridge member 310 is in the opening OP. The bridge member 310 is on the rear surface of the light blocking member 330 to be at the same layer as the buffer member 340. In the present exemplary embodiment, the bridge member 310 and the buffer member 340 are at an upper surface of the bracket 500.

An upper surface of the bridge member 310 contacts the rear surface of the light blocking member 330, and a rear surface of the bridge member 310 contacts the upper surface of the bracket 500. The bridge member 310 may hold a position of the light blocking member 330 and the bracket 500.

At least a portion of a surface (e.g., a side surface) of the bridge member 310, which connects the upper surface of the bridge member 310 and the rear surface of the bridge member 310, contacts the buffer member 340.

When viewed in a plan view, the bridge member 310 is surrounded by the buffer member 340. The bridge member 310 may extend along a direction in which at least an edge of the display panel 200 extends.

The bridge member 310 may be provided in a plural number. In the present exemplary embodiment, the bridge members 310 extend in the second direction DR2, and are spaced from each other in the first direction DR1 (e.g., spaced at regular intervals).

In FIG. 4, the bridge member 310 has a substantially quadrangular shape when viewed in a plan view, but the shape of the bridge member 310 is not limited to the quadrangular shape. That is, the bridge member 310 may have a variety of shapes (e.g., a polygonal shape, a circular shape, etc.).

The bridge member 310 may have the same thickness (e.g., in the third direction DR3) as that of the buffer member 340. The bridge member 310 may include at least one of polyethylene terephthalate (PET), stainless steel, and resin. In addition, the bridge member 310 includes the OCA and/nor the OCR, and thus the bridge member 310 is attached to the buffer member 340, the light blocking member 330, and the bracket 500.

In the present exemplary embodiment, because the bridge member 310 is at the same layer as the buffer member 340, the bridge member 310 may hold, or support, the light blocking member 330 and the bracket 500, which are respectively disposed at upper and lower portions of the buffer member 340, even when the buffer member 340 is damaged by external impact. Accordingly, damage to the display device 1000 due to the external impacts may be prevented or reduced.

As described above, because the bridge member 310 forms the same layer (e.g., the layer of the cover panel 300) with not only the buffer member 340, but also with each member damaged by the external impacts among members included in the cover panel 300, the bridge member 310 may reduce or prevent damage to the display device 1000.

Figure 5:
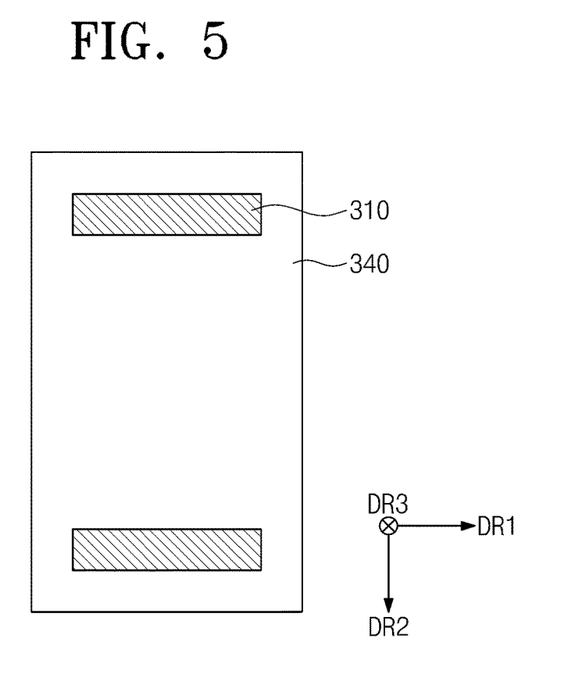
FIGS. 5 to 7 are plan views showing a rear surface of a cover panels according to various exemplary embodiments of the present disclosure.
Figure 6:
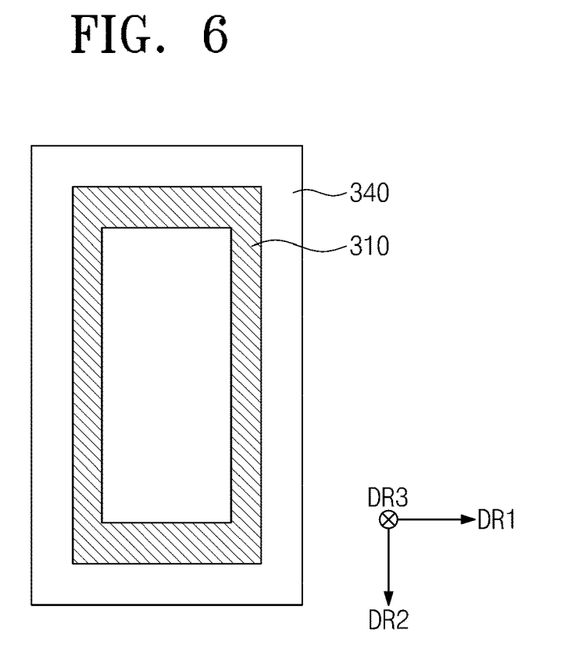
Figure 7:
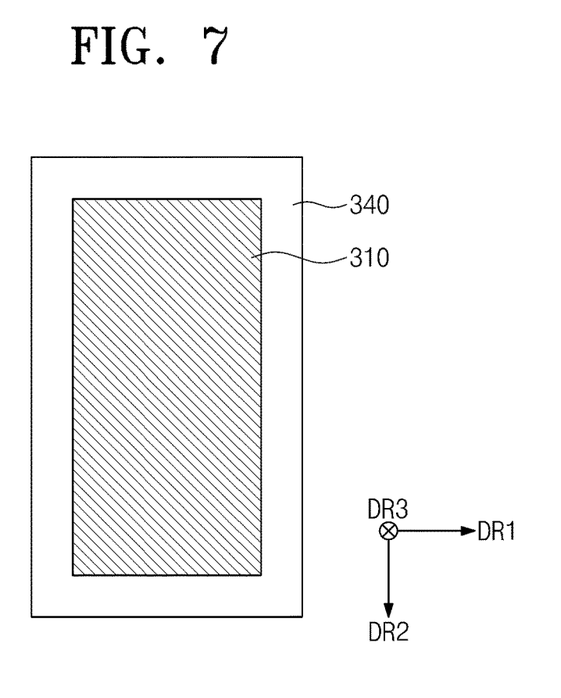

FIGS. 5 to 7 are plan views showing a rear surface of a cover panels according to various exemplary embodiments of the present disclosure. Hereinafter, various examples of the bridge member 310 respectively corresponding to the embodiments are described.

Referring to FIG. 5, the bridge member 310 may be provided in a plural numbers. The bridge members 310 may extend in the first direction DR1, and may be spaced apart from each other in the second direction DR2.

Referring to FIG. 6, the bridge member 310 may extend along four sides of the display panel 200, and thus the bridge member 310 may have a rectangular ring shape (e.g., may extend along, or may be adjacent, a periphery, or edge, of the display panel 200). When viewed in a plan view, the bridge member 310 of the present embodiment is surrounded by the buffer member 340. However, in other embodiment, one or more side surfaces of the bridge member 310 may be exposed to the outside.

Referring to FIG. 7, the bridge member 310 has an area that is smaller than an area of the display panel 200, when viewed in a plan view. In addition, the area of the bridge member 310 is smaller than an area of the buffer member 340. The bridge member 310 has the same shape as that of the buffer member 340, and is at a center portion of the buffer member 340, although the bridge member 310 should not be limited thereto or thereby. For instance, the bridge member 310 may have a variety of shapes (e.g., a polygonal shape, a circular shape, etc.), and the position of the bridge member 310 may be changed, as suitable.

As described above, the bridge member 310 may have various shapes, and the shape and/or the area of the bridge member 310 may be varied. When the area of the bridge member 310 is large with respect to the area of the buffer member 340, an absorption amount of the buffer member 340, with respect to the external impact, may be reduced. On the contrary, when the area of the bridge member 310 becomes small with respect to the area of the buffer member 340, an adhesive force of the bridge member 310 may become weak due to the external impact, and as a result, the display device 1000 may be damaged. Therefore, the area of the buffer member 340 and the area of the bridge member 310 may be changed in accordance with weight and size of the display device 1000.

Hereinafter, a display device according to another exemplary embodiment of the present disclosure will be described in detail with reference to accompanying drawings.

Figure 8:
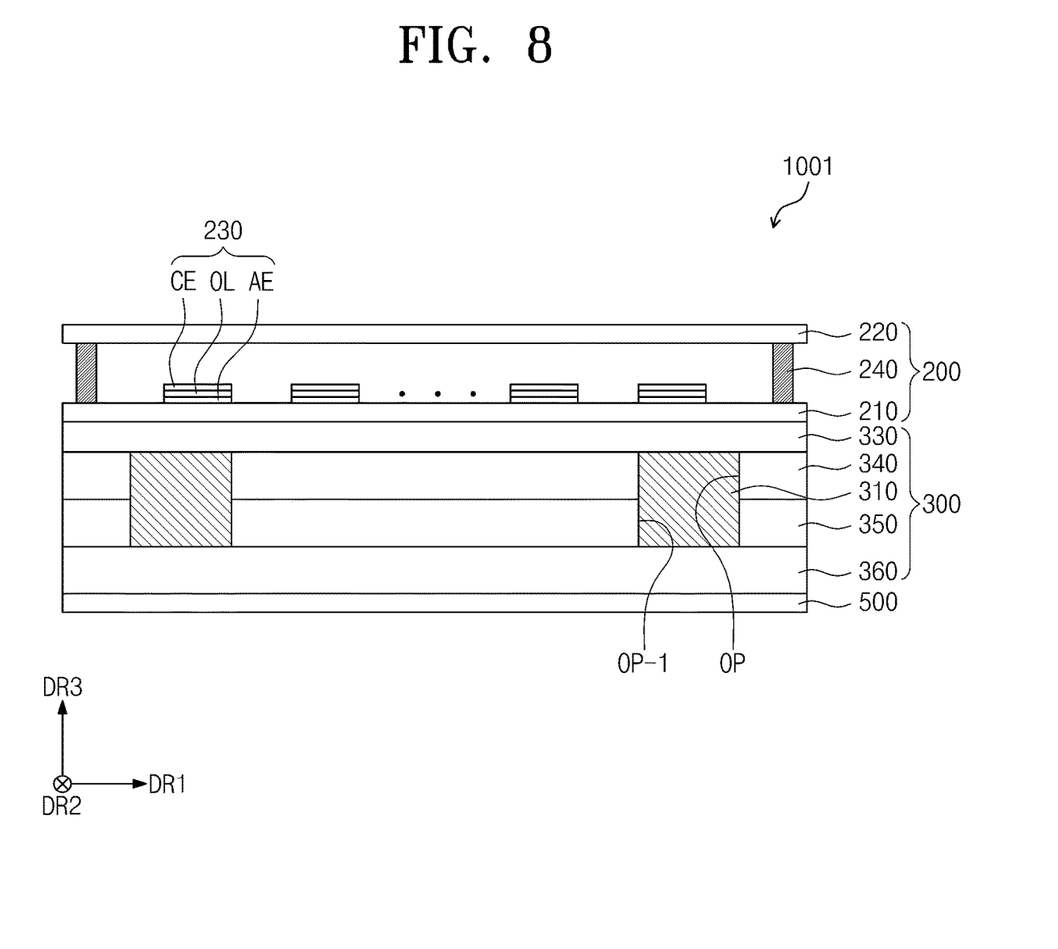
FIG. 8 is a cross-sectional view showing a display device according to another exemplary embodiment of the present disclosure.

FIG. 8 is a cross-sectional view showing a display device 1001 according to another exemplary embodiment of the present disclosure. In FIG. 8, the same reference numerals denote the same elements in the previously described embodiments, and thus detailed descriptions of the same elements will be omitted.

Referring to FIG. 8, the display device 1001 includes a display panel 200, a cover panel 300, and a bracket 500. The cover panel 300 includes a light blocking member 330, a buffer member 340, a heat discharge member 350, a bridge member 310, and a radiating member 360.

The light blocking member 330 is attached to a rear surface of the display panel 200 to block the light incident to the display panel 200.

The buffer member 340 is at a rear surface of the light blocking member 330, and distributes impacts applied to the display panel 200 and the window member 100. The buffer member 340 includes/defines an opening OP formed therethrough when viewed in a plan view.

The heat discharge member 350 is at a rear surface of the buffer member 340, and effectively discharges heat generated by the display panel 200. The heat discharge member 350 may include a heat discharge adhesive layer, a graphite layer, a protective layer, and a blocking layer.

The heat discharge adhesive layer may be between the buffer member 340 and the graphite layer to attach the buffer member 340 and the graphite layer. The heat discharge adhesive layer may include an optically clear adhesive (OCA) and/or an optically clear resin (OCR).

The graphite layer may include graphite, which is formed from carbon atoms in layers in which the carbon atoms are connected to each other in a horizontal direction (e.g., in a direction, or plane, corresponding to the first and second directions). Accordingly, the graphite layer has high heat conductivity in the horizontal direction, which may be higher than heat conductivity in a vertical direction (e.g., the third direction), and has an excellent heat discharge property.

The protective layer faces the heat discharge adhesive layer such that the graphite layer is between the protective layer and the heat discharge adhesive layer. The protective layer reduces the likelihood, or prevents, dislodging of the graphite of the graphite layer. The protective layer includes polyethylene terephthalate (PET).

The blocking layer is on the buffer member 340, and surrounds the heat discharge adhesive layer, the graphite layer, and the protective layer when viewed in a plan view. The blocking layer seals the graphite layer together with the heat discharge adhesive layer, the graphite layer, and the protective layer. The blocking layer includes polyethylene terephthalate (PET).

The heat discharge member 350 includes an opening OP-1 formed therethrough that is connected to (e.g., in fluid communication with) the opening OP of the buffer member 340 when viewed in a plan view.

The bridge member 310 penetrates through the buffer member 340 and the discharge member 350. The bridge member 310 is at the rear surface of the light blocking member 330, and is in the opening OP of the buffer member 340 and in the opening OP-1 of the heat discharge member 350. An upper surface of the bridge member 310 is at the same plane as an upper surface of the buffer member 340, and a rear surface of the bridge member 310 is at the same plane as a rear surface of the discharge member 350.

The upper surface of the bridge member 310 makes contact with the rear surface of the light blocking member 330, and the rear surface of the bridge member 310 makes contact with an upper surface of the radiating member 360. The bridge member 310 may hold a position of the light blocking member 330 and the radiating member 360.

At least a portion of a side surface of the bridge member 310 (e.g., a surface connecting the upper surface and the rear surface of the bridge member 310) makes contact with the buffer member 340 and the heat discharge member 350. The side surface(s) of the bridge member 310 is surrounded by the buffer member 340 and the heat discharge member 350.

The bridge member 310 has a thickness that is substantially equal to a combined thickness of the buffer member 340 and the heat discharge member 350. That is, the thickness of the bridge member 310 may be substantially the same as a distance between the light blocking member 330 and the radiating member 360.

The radiating member 360 is attached to a rear surface of the heat discharge member 350, and overlaps the heat discharge member 350 and the bridge member 310. The radiating member 360 shields an electromagnetic interference generated by the printed circuit board PCB. In addition, the radiating member 360 discharges the heat generated by the display panel 200 in cooperation with the heat discharge member 350. The radiating member 360 includes a first radiating adhesive layer, a conductive sheet, and a second radiating adhesive layer.

The first radiating adhesive layer is between the heat discharge member 350 and the conductive sheet to attach the heat discharge member 350 and the conductive sheet. The first radiating adhesive layer includes an optically clear adhesive (OCA) and/or an optically clear resin (OCR).

The conductive sheet may include copper, nickel, and/or ferrite, although the conductive sheet is not limited thereto or thereby. The conductive sheet may shield electromagnetic interference, and may include various materials having superior heat conductivity.

The second radiating adhesive layer is between the conductive sheet and the bracket 500 to attach the conductive sheet to the bracket 500. The second radiating adhesive layer includes a conductive material to electrically connect the conductive sheet and the bracket 500. The second radiating adhesive layer includes the OCA and/or the OCR.

In the present exemplary embodiment, because the bridge member 310 forms the same layer with the buffer member 340 and the heat discharge member 350, the bridge member 310 may hold, or support, the positions of the light blocking member 330 above the buffer member 340, and the radiating member 360 under the heat discharge member 350, even when the buffer member 340 and the heat discharge member 350 are damaged by external impacts. That is, the bridge member 310 may support the positions of the light blocking member and the radiating member 360 with respect to each other. Accordingly, damage to the display device 1001 due to the external impacts may be prevented or reduced.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed by the following claims and their equivalents.

What is claimed is:

1. A display device comprising:
    a display panel comprising a substrate, a light emitting element on the substrate, and a sealing layer on the light emitting element;
    a light blocking member on a rear surface of the substrate;
    a buffer member on a rear surface of the light blocking member and defining an opening on a plane; and
    a bridge member on the rear surface of the light blocking member, located in the opening, and non-overlapped with the buffer member in a thickness direction of the display device,
    wherein a display area configured to display an image, and a non-display area adjacent to the display area, are defined in the display panel,
    wherein the buffer member and the bridge member overlap the display area in the thickness direction, and
    wherein the light blocking member overlaps with an entire area of the display area.

2. The display device of claim 1, wherein each of the opening and the bridge member has a rectangular shape on a plane.

3. The display device of claim 2, wherein the bridge member comprises first sub-members extending along a first direction and spaced apart in a second direction intersecting the first direction and second sub-members extending along the second direction and spaced apart in the first direction, wherein the first sub-members and the second sub-members are connected to each other and have the rectangular shape on a plane.

4. The display device of claim 1, wherein the bridge member comprises at least one of a polyethylene terephthalate, a stainless steel, or a resin.

5. The display device of claim 1, wherein the bridge member comprises an adhesive material, and the bridge member is attached to the light blocking member.

6. The display device of claim 1, wherein the buffer member comp rises a polymer resin or a sponge formed by foam molding a rubber solution, a urethane-based material, or an acrylic-based material.

7. The display device of claim 1, wherein a thickness of the buffer member and the thickness of a bridge member are different from each other.

8. The display device of claim 1, further comprising a light blocking adhesive layer between the display panel and the light blocking member.

9. The display device of claim 1, further comprising a window member comprising a transmitting area configured to transmit the image provided from the display panel, wherein the display panel disposed between the window member and the light blocking member.

10. A display device comprising:
    a display panel comprising a display area configured to display an image and a n on-display area adjacent the display area;
    a light blocking member on a rear surface of the display panel;
    a first member attached to a rear surface of the light blocking member; and
    a second member attached to the rear surface of the light blocking member, wherein the first member is non-overlapped with the second member in a thickness direction of the display device,
    wherein the first member and the second member overlap with the display area of the display panel when viewed in the thickness direction,
    wherein the light blocking member overlaps with an entire area of the display area, and
    wherein an area of the light blocking member is greater than an area of the display area.

11. The display device of claim 10, wherein the first member has a rectangular shape on a plane, and
    wherein the second member comprises a first sub member surrounded by the first member on a plane and a second sub member surrounding the first member on a plane.

12. The display device of claim 10, wherein the first member comprises an adhesive material, and the second member comprises a polymer resin or a sponge formed by foam molding a rubber solution, a urethane-based material, or an acrylic-based material.

13. The display device of claim 10, wherein the display panel is an organic light emitting display panel.

14. A display device comprising:
    a display panel comprising a display area configured to display an image and a non-display area adjacent the display area;
    a light blocking member under the display panel and completely covering the display area of the display panel;
    a bridge member under the display area of the display panel and comprising an adhesive material; and
    a buffer member under the display area and non-overlapping the bridge member in a thickness direction of the display device,
    wherein the display panel displays the image in a direction from a rear surface of the display panel toward an upper surface of the display panel, and the bridge member and the buffer member are spaced apart from the upper surface with the rear surface interposed therebetween.

15. The display device of claim 14, wherein the light blocking member is between the display panel and the bridge member and is between the display panel and the buffer member.

16. The display device of claim 15, wherein the light blocking member is a continuous member and the light blocking member overlaps with an entire area of the display area.

* * * * *

UNITED STATES PATENT AND TRADEMARK OFFICE
CERTIFICATE OF CORRECTION

| | | |
|---|---|---|
| PATENT NO. | : 10,842,033 B2 | Page 1 of 1 |
| APPLICATION NO. | : 15/919087 | |
| DATED | : November 17, 2020 | |
| INVENTOR(S) | : Tae-Eun Kim et al. | |

It is certified that error appears in the above-identified patent and that said Letters Patent is hereby corrected as shown below:

In the Claims

Column 11, Line 65, Claim 6          delete "comp rises" and insert -- comprises --

Column 12, Line 14 (approx.), Claim 10      delete "n on" and insert -- non --

Signed and Sealed this
Sixteenth Day of November, 2021

Drew Hirshfeld
*Performing the Functions and Duties of the*
*Under Secretary of Commerce for Intellectual Property and*
*Director of the United States Patent and Trademark Office*